United States Patent
Ota

(10) Patent No.: US 7,732,993 B2
(45) Date of Patent: Jun. 8, 2010

(54) ULTRASONIC SENSOR AND METHOD FOR MANUFACTURING THE SAME

(75) Inventor: Jyunshi Ota, Hakusan (JP)

(73) Assignee: Murata Manufacturing Co., Ltd., Kyoto-fu, Tokyo (*) Notice: Subject to any disclaimer, the term of this patent is extended or adjusted under 35 U.S.C. 154(b) by 0 days.

(21) Appl. No.: 12/204,448

(22) Filed: Sep. 4, 2008

(65) Prior Publication Data

US 2008/0309201 A1  Dec. 18, 2008

Related U.S. Application Data

(63) Continuation of application No. PCT/JP2007/054178, filed on Mar. 5, 2007.

(30) Foreign Application Priority Data

Mar. 6, 2006  (JP)  ............... 2006-058948

(51) Int. Cl.
*H01L 41/08* (2006.01)
(52) U.S. Cl. ..................................... 310/336
(58) Field of Classification Search ......... 310/334–337, 310/311, 330, 348; 73/649, 644, 632; 367/157, 367/163; *H01L 4/22; H04R 17/00*
See application file for complete search history.

(56) References Cited

U.S. PATENT DOCUMENTS 6,250,162 B1 * 6/2001 Amaike et al. .............. 310/334
6,876,127 B2 * 4/2005 Mitsuoka et al. ............ 310/334
7,545,082 B2 * 6/2009 Nakajima .................... 310/334

FOREIGN PATENT DOCUMENTS

| JP | 2-145895 | 6/1990 |
| JP | 04-258100 | 9/1992 |
| JP | 62-77998 | 10/1994 |
| JP | 08-340598 | 12/1996 |
| JP | 09-252498 | 9/1997 |
| JP | 09-284896 | 10/1997 |
| JP | 2004-253911 | 9/2004 |
| JP | 2005-072771 | 3/2005 |

OTHER PUBLICATIONS

PCT/JP2007/054178 International Search Report dated May 6, 2007.
PCT/JP2007/054178 Written Opinion dated May 6, 2007.

* cited by examiner

*Primary Examiner*—Water Benson
*Assistant Examiner*—Karen B Addison
(74) *Attorney, Agent, or Firm*—Dickstein, Shapiro, LLP.

(57) ABSTRACT

An ultrasonic sensor with stabilized transmitting/receiving characteristics capable of achieving a desired directivity easily and at low cost and a method for manufacturing the same are provided. The ultrasonic sensor includes a base composed of a synthetic resin. The base includes a cylindrical side portion and a ring-shaped bent portion extending inward from a first opening of the side portion. A ring-shaped recessed portion is provided in the inner surface of the bent portion adjacent to the end of the bent portion. A piezoelectric element is disposed on the recessed portion. A sound absorber and a weight are fitted and fixed in the base. An outer casing composed of a synthetic resin is provided so as to cover the outer surface of the piezoelectric element and the outer surface of the base.

16 Claims, 15 Drawing Sheets

ULTRASONIC SENSOR AND METHOD FOR MANUFACTURING THE SAME

CROSS REFERENCE TO RELATED APPLICATIONS

The present application is a continuation of International Application No. PCT/JP2007/054178, filed Mar. 5, 2007, which claims priority to Japanese Patent Application No. JP2006-058948, filed Mar. 6, 2006, the entire contents of each of these applications being incorporated herein by reference in their entirety.

FIELD OF THE INVENTION

The present invention relates to ultrasonic sensors and methods for manufacturing the same, and in particular, relates to drip-proof ultrasonic sensors used for, for example, rear sonar devices or corner sonar devices for automobiles and methods for manufacturing the same.

BACKGROUND OF THE INVENTION

FIG. 21 is a front view illustrating an example of a known ultrasonic sensor, and FIG. 22 is a plan view of the ultrasonic sensor taken along line A-A in FIG. 21. An ultrasonic sensor 1 includes a case 2 composed of a metal such as aluminum having a substantially rectangular tube shape with a bottom portion. The case 2 has a recessed portion on the inside and a rectangular or an elliptic opening so that the ultrasonic sensor 1 achieves a desired directivity. A first surface of a-piezoelectric element 3 is bonded to the inner surface of the bottom portion of the case 2 using an adhesive. Moreover, a first signal line 4a of a cable 4 is soldered to the inner surface of the case 2, and is electrically connected to an electrode on the first surface of the piezoelectric element 3 via the case 2. Furthermore, a second signal line 4b of the cable 4 is soldered to an electrode on a second surface of the piezoelectric element 3 so as to be electrically connected. Moreover, a sound absorber 5 composed of, for example, felt is disposed on the second surface of the piezoelectric element 3. Furthermore, an insulating resin filler 6 composed of, for example, silicon rubber or urethane rubber is disposed inside the case 2. This insulating resin filler 6 hermetically seals the piezoelectric element 3 and the sound absorber 5, and insulates the signal lines 4a and 4b from each other.

When a distance to an object to be detected is measured using this ultrasonic sensor 1, the piezoelectric element 3 is driven by applying driving voltages to the signal lines 4a and 4b of the cable 4. The bottom surface of the case 2 also vibrates in response to the vibration of the piezoelectric element 3, and emits ultrasonic waves in a direction orthogonal to the bottom surface. When the ultrasonic waves emitted from the ultrasonic sensor 1 are reflected from the object to be detected and reach the ultrasonic sensor 1, the piezoelectric element 3 vibrates. The vibration is converted into electrical signals, and the electrical signals are output from the signal lines 4a and 4b of the cable 4. Therefore, the distance from the ultrasonic sensor 1 to the object to be detected can be measured by measuring the time period from the application of the driving voltages to the output of the electrical signals (see Patent Document 1).

Herein, the resonant frequency of this ultrasonic sensor 1 is 40 kHz. FIG. 23 illustrates the reverberation characteristic of the ultrasonic sensor 1 when driving voltages are applied.

Patent Document 1: Japanese Unexamined Patent Application Publication No. 9-284896

The ultrasonic sensor 1 shown in FIG. 21 has the following problems.

First, since the piezoelectric element 3 is bonded to the surface of the bottom portion of the case 2 using an adhesive, the amount or the bonding position of the adhesive may vary, resulting in variations in ultrasonic-wave transmitting/receiving characteristics.

Moreover, it is necessary to form the metallic case 2 with a complicated shape so that a desired directivity is achieved, and the transmitting/receiving characteristics may vary in accordance with the variations among the manufactured cases 2.

Furthermore, since the case 2 is composed of a metal, the case 2 may be oxidized at the portion where the piezoelectric element 3 is bonded. This also leads to variations in the ultrasonic-wave transmitting/receiving characteristics.

SUMMARY OF THE INVENTION

Therefore, a main object of the present invention is to provide an ultrasonic sensor with stabilized transmitting/receiving characteristics capable of achieving a desired directivity easily and at low cost and a method for manufacturing the same.

An ultrasonic sensor according to the present invention includes a piezoelectric element; a base for accommodating the piezoelectric element having a cylindrical side portion and a bent portion extending inward from a first opening of the side portion, a recessed portion on which the piezoelectric element is disposed being provided in the inner surface of the bent portion adjacent to the end of the bent portion, the first opening being closed by the piezoelectric element disposed on the recessed portion and the bent portion; and an outer casing covering the outer surface of the piezoelectric element and the outer surface of the base from outside the base.

In the ultrasonic sensor according to the present invention, bending vibration preferably occurs in the outer casing during driving The ultrasonic sensor according to the present invention can further include, for example, a columnar weight fitted in the base so as to be in contact with the inner surface of the base and having a depressed portion for preventing a portion of the weight facing the piezoelectric element from being brought into contact with the piezoelectric element. Alternatively, the ultrasonic sensor according to the present invention can further include, for example, a cylindrical weight fitted in the base so as to be in contact with the inner surface of the base and having a depressed portion for preventing a portion of the weight facing the piezoelectric element from being brought into contact with the piezoelectric element. In these cases, the weight is preferably composed of a material with a density higher than those of the materials of the base and the outer casing.

Moreover, the ultrasonic sensor according to the present invention can further include one or more piezoelectric elements and one or more bases corresponding to the piezoelectric elements, and the outer casing can cover the outer surfaces of the piezoelectric elements and the outer surfaces of the bases.

A method for manufacturing an ultrasonic sensor according to the present invention, the ultrasonic sensor including a piezoelectric element; a base for accommodating the piezoelectric element having a cylindrical side portion and a bent portion extending inward from a first opening of the side portion, a recessed portion on which the piezoelectric element is disposed being provided in the inner surface of the bent portion adjacent to the end of the bent portion, the first opening being closed by the piezoelectric element disposed on the recessed portion and the bent portion; and an outer casing covering the outer surface of the piezoelectric element and the outer surface of the base from outside the base, includes preparing the piezoelectric element and the base; placing the piezoelectric element on the recessed portion of the base; inserting the piezoelectric element disposed on the recessed portion and the base into a filling mold with a bottom for covering the outer surface of the piezoelectric element disposed on the recessed portion and the outer surface of the base; forming the outer casing in gaps between the outer surface of the piezoelectric element and the inner surface of the filling mold and between the outer surface of the base and the inner surface of the filling mold by applying a material of the outer casing in gaps between the piezoelectric element and the filling mold and between the base and the filling mold; and removing the filling mold from the outer casing.

The method for manufacturing an ultrasonic sensor according to the present invention, the ultrasonic sensor further including a weight fitted in the base so as to be in contact with the inner surface of the base and having a depressed portion for preventing a portion of the weight facing the piezoelectric element from being brought into contact with the piezoelectric element, can further include preparing the weight; and inserting the weight into the base such that the weight is brought into contact with the inner surface of the base, the piezoelectric element being disposed on the recessed portion of the base, and bonding the weight to the inner surface of the base.

In the ultrasonic sensor according to the present invention, the piezoelectric element can be accurately positioned since the piezoelectric element is disposed on the recessed portion provided in the bent portion of the base, and variations in transmitting/receiving characteristics can be reduced.

Moreover, since the piezoelectric element is disposed on the recessed portion provided in the inner surface of the bent portion of the base in the ultrasonic sensor according to the present invention, the thickness (amount) of the outer casing provided on a surface of the piezoelectric element adjacent to a transmitting/receiving side is increased compared with the case where the piezoelectric element is disposed on the outer surface (transmitting/receiving side) of the bent portion of the base. With this, bending can easily occur and bending vibration with large amplitude occurs due to the imbalance of the vibration transmitted on both surfaces of the piezoelectric element. Thus, desired transmitting/receiving characteristics can be obtained. When the piezoelectric element is disposed on the transmitting/receiving side of the bent portion of the base, the thickness (amount) of the outer casing provided on the surface of the piezoelectric element adjacent to the transmitting/receiving side is reduced, and acceptable characteristics cannot be achieved. In contrast, as in the ultrasonic sensor according to the present invention, bending or bending vibration can easily occur as the difference in thickness (amount) of the outer casing and the like on both surfaces of the piezoelectric element is increased. With this, characteristics of sound pressure and sensitivity as an ultrasonic sensor can be improved, and desired transmitting/receiving characteristics can be obtained.

When the ultrasonic sensor according to the present invention includes the weight fitted in the base and having the depressed portion, the directivity of the ultrasonic sensor can be changed by changing the shape of the depressed portion of the weight, and can be controlled with a simple structure. Moreover, since unnecessary vibration of the side portion of the base can be suppressed by the weight in this case, only the necessary vibrating surface can be efficiently vibrated. Furthermore, in this case, unnecessary vibration of the side portion of the base can be further suppressed when the weight is composed of a material with a density higher than those of the base and the outer casing.

Moreover, when the ultrasonic sensor according to the present invention includes the weight having the depressed portion, the reverberation characteristic can be improved by placing a sound absorber in the depressed portion of the weight. In this case, when the weight is cylindrical, the reverberation characteristic can be further improved by placing a sound absorber also inside the weight.

Furthermore, when the outer casing covers the outer surfaces of the piezoelectric elements and the outer surfaces of the bases in the ultrasonic sensor according to the present invention, complicated structures including the plurality of piezoelectric elements can be easily manufactured, and the angle to an object to be detected such as an obstacle can be measured in addition to the distance to the object to be detected.

According to the present invention, an ultrasonic sensor with stabilized transmitting/receiving characteristics capable of achieving a desired directivity easily and at low cost can be obtained.

The above-described objects, other objects, features, and advantages of the present invention will become more apparent from the following detailed description of best modes for carrying out the invention taken in conjunction with the accompanying drawings.

Figure 1:
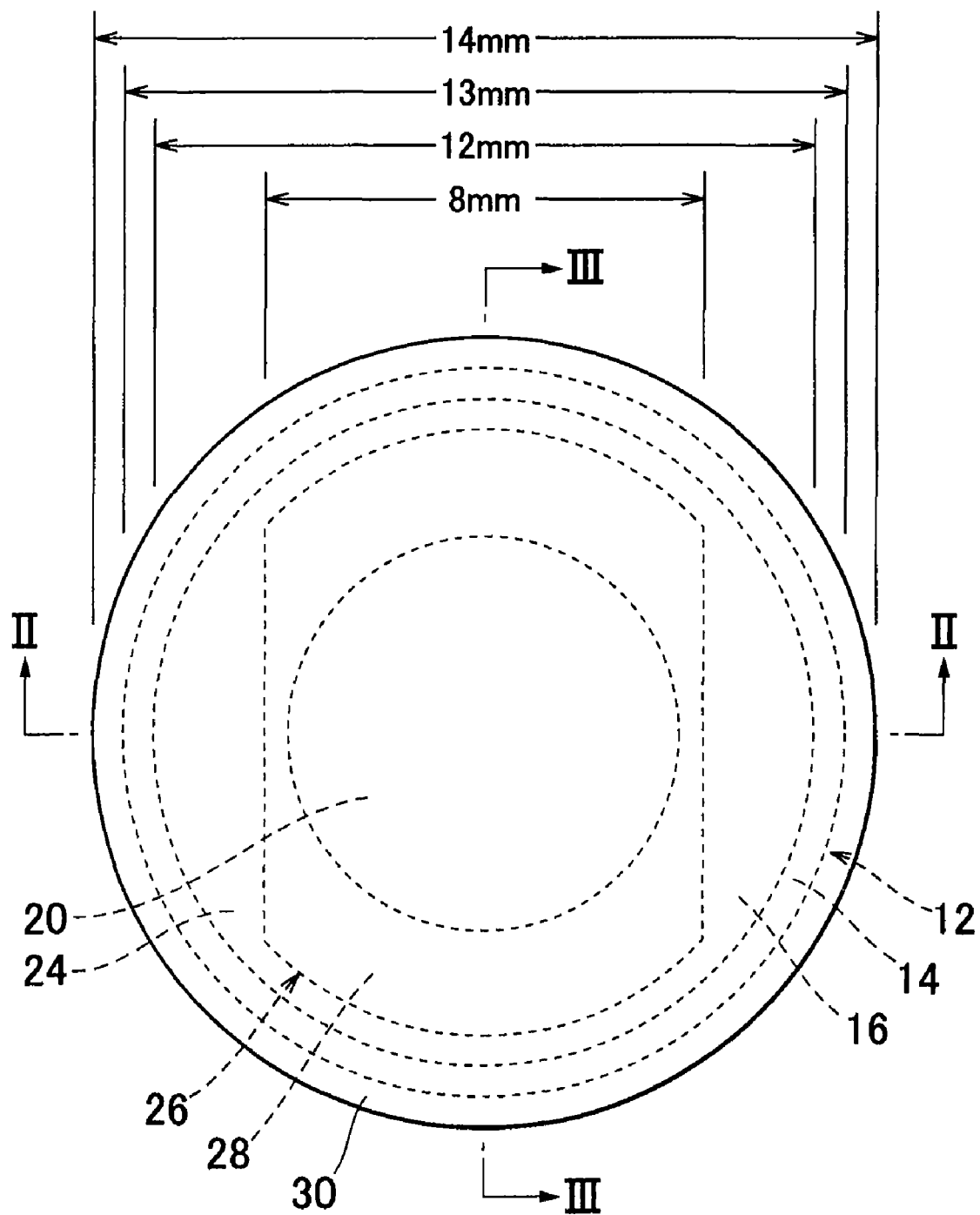
FIG. 1 is a plan view illustrating an example of the ultrasonic sensor according to the present invention.

REFERENCE NUMERALS 10 ultrasonic sensor
12 base
14 side portion
16 bent portion
18 recessed portion
20 piezoelectric element
22a and 22b lead wires
24 weight
26 depressed portion
28 sound absorber
30 outer casing

DETAILED DESCRIPTION OF THE INVENTION

Figure 2:
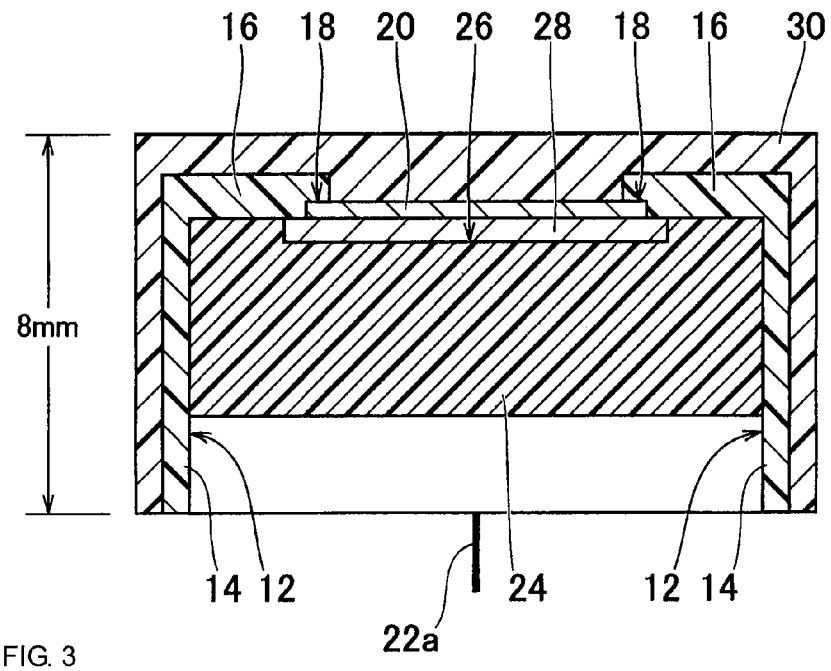
FIG. 2 is a cross-sectional view taken along line II-II in FIG. 1.
Figure 3:
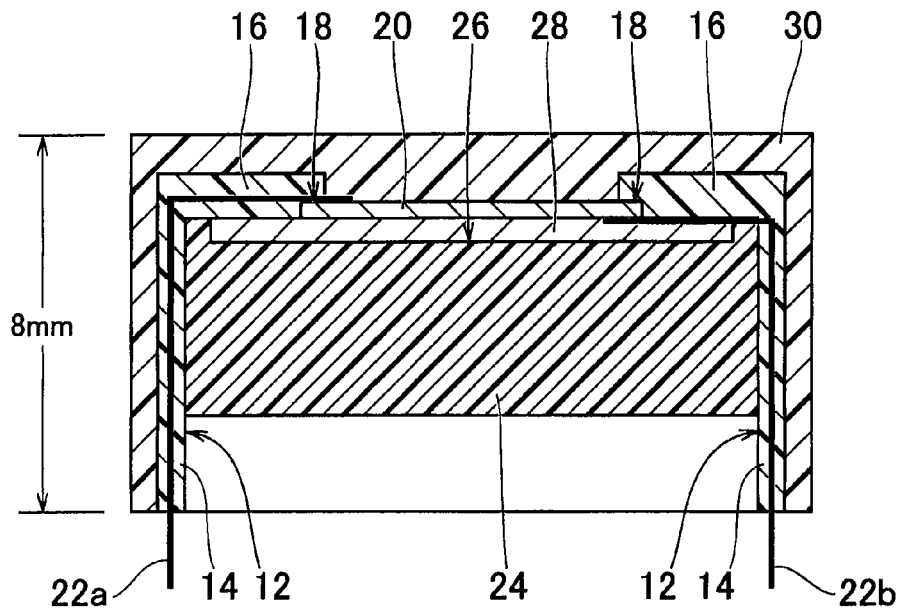
FIG. 3 is a cross-sectional view taken along line III-III in FIG. 1.

FIG. 1 is a plan view illustrating an example of the ultrasonic sensor according to the present invention, FIG. 2 is a cross-sectional view taken along line II-II in FIG. 1, and FIG. 3 is a cross-sectional view taken along line III-III in FIG. 1. This ultrasonic sensor 10 includes a base 12 composed of, for example, a synthetic resin. The base 12 includes a cylindrical side portion 14 having, for example, an outer diameter of 13 mm and an inner diameter of 12 mm. The side portion 14 accommodates a piezoelectric element 20 (described below). A ring-shaped bent portion 16, for example, extends inward from a first opening of the side portion 14. A ring-shaped recessed portion 18, for example, on which the below-mentioned piezoelectric element 20 is disposed is provided in the inner surface of the bent portion 16 adjacent to the end of the bent portion. The height of the recessed portion 18 substantially corresponds to the thickness of the below-mentioned piezoelectric element 20.

The disc-shaped piezoelectric element 20 having an outer diameter of, for example, about 7 mm is disposed on the recessed portion 18 provided in the bent portion 16 of the base 12. The piezoelectric element 20 includes, for example, a disc-shaped piezoelectric substrate and electrodes provided on both main surfaces of the substrate. The first opening of the side portion 14 of the base 12 is closed with the bent portion 16 and the piezoelectric element 20.

First ends of lead wires 22a and 22b are soldered to the respective electrodes on both main surfaces of the piezoelectric element 20 so as to be electrically connected. Intermediate portions of these lead wires 22a and 22b are embedded in the side portion 14 and the bent portion 16 of the base 12 in advance by insert molding, and second ends are exposed from a second opening of the side portion 14 of the base 12. The intermediate portions of the lead wires 22a and 22b can be disposed inside or outside the base 12 instead of being embedded in the base 12.

Figure 4:
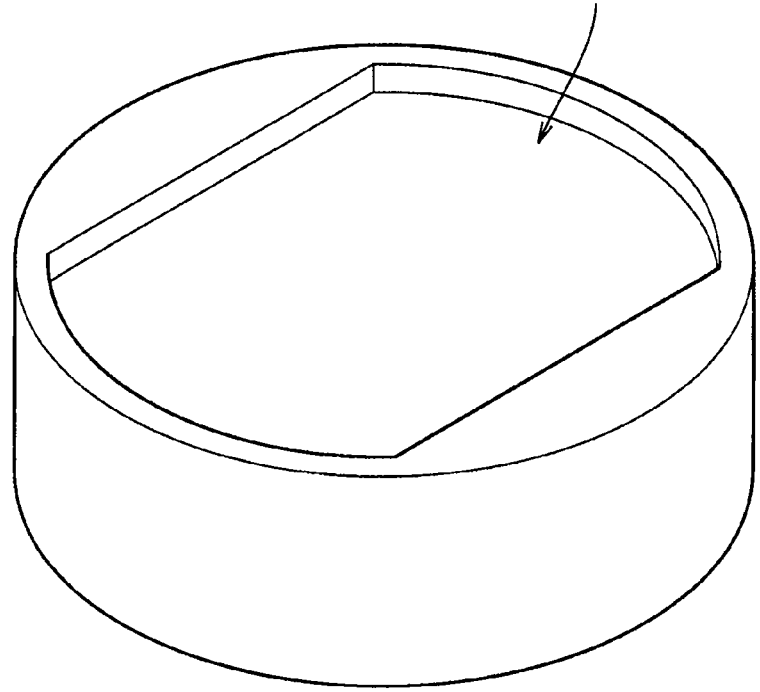
FIG. 4 is a perspective view illustrating a weight used for the ultrasonic sensor shown in FIG. 1.

A columnar weight 24 having an outer diameter of, for example, 12 mm is fitted in the base 12 so as to be in contact with the inner surface of the base 12. The weight 24 suppresses unnecessary vibration of the side portion 14 of the base 12, and controls the directivity of the ultrasonic sensor 10. The weight 24 has a density higher than that of the material of the base 12, and is composed of, for example, a synthetic resin having a density higher than that of the material of an outer casing 30 (described below). The weight 24 can be composed of other materials such as a ceramic and a metal instead of a synthetic resin. The weight 24 is bonded to the inner surface of the base 12 using an adhesive. Moreover, as shown in FIG. 4, the weight 24 has, for example, a substantially elliptic depressed portion 26 at the center of a first main surface. The depressed portion 26 is provided so that a portion of the weight 24 facing the piezoelectric element 20 is not brought into contact with the piezoelectric element 20. The depressed portion 26 has, for example, a width of 8 mm and a length of about 11 mm. An elastic sound absorber 28 composed of, for example, sponge is fitted in this depressed portion 26.

The outer casing 30 composed of, for example, a synthetic resin is disposed outside the base 12 so as to cover the outer surfaces of the base 12 and the piezoelectric element 20. A portion of the outer casing 30 over the piezoelectric element 20 facilitates generation of bending or bending vibration when driving voltages are applied to the piezoelectric element 20. The thickness of the outer casing 30 over the side portion 14 is larger than that over the piezoelectric element 20 so that the vibration at the side portion 14 of the base 12 is reduced. The outer casing 30 has, for example, an outer diameter of 14 mm and a height of 8 mm.

Next, an example method for manufacturing the ultrasonic sensor 10 will be described.

First, the base 12, the piezoelectric element 20, the weight 24, and the sound absorber 28, for example, are prepared. The base 12 has the side portion 14 and the bent portion 16, and the recessed portion 18 is provided in the bent portion 16. The intermediate portion of the lead wires 22a and 22b are embedded in the side portion 14 and the bent portion 16 by insert molding if required. Moreover, electrodes are provided on both main surfaces of the piezoelectric element 20. Furthermore, the depressed portion 26 is provided in the weight 24.

The piezoelectric element 20 is disposed on the recessed portion 18 provided in the bent portion 16 of the base 12. The first ends of the lead wires 22a and 22b are soldered to the respective electrodes on both main surfaces of the piezoelectric element 20 disposed on the recessed portion 18 so as to be electrically connected. The intermediate portion of the lead wires 22a and 22b can be embedded in the side portion 14 and the bent portion 16 of the base 12 by insert molding after the first ends of the lead wires are connected to the respective electrodes on both main surfaces of the piezoelectric element 20. Moreover, when the intermediate portion of the lead wires 22a and 22b are disposed inside or outside the base 12, the first ends of the lead wires 22a and 22b are soldered to the respective electrodes on both main surfaces of the piezoelectric element 20 so as to be electrically connected before or after the piezoelectric element 20 is disposed on the recessed portion 18.

Furthermore, the sound absorber 28 is disposed on the piezoelectric element 20 inside the base 12, and the weight 24 is inserted into the base 12 so as to be brought into contact with the inner surface of the base and bonded to the inner surface of the base 12 using an adhesive. With this, the piezoelectric element 20, the sound absorber 28, and the weight 24 are fixed to the base 12. The sound absorber 28 can be disposed on the piezoelectric element 20 by inserting the sound absorber into the base 12 together with the weight 24 while the sound absorber is fitted in the depressed portion 26 of the weight 24.

Figure 5:
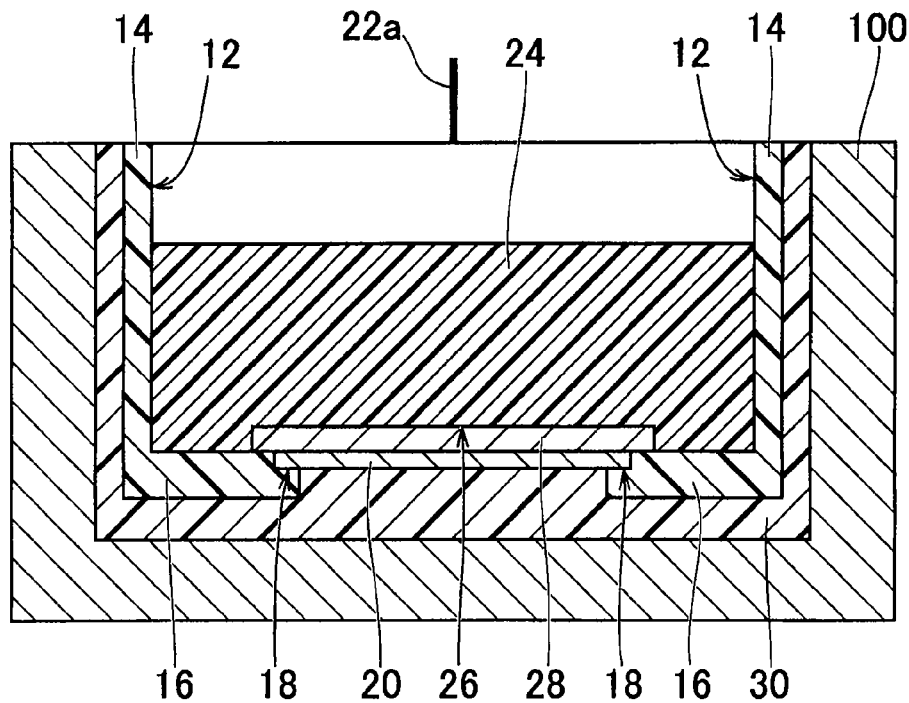
FIG. 5 is a front view illustrating a process of manufacturing the ultrasonic sensor shown in FIG. 1.
Figure 6:
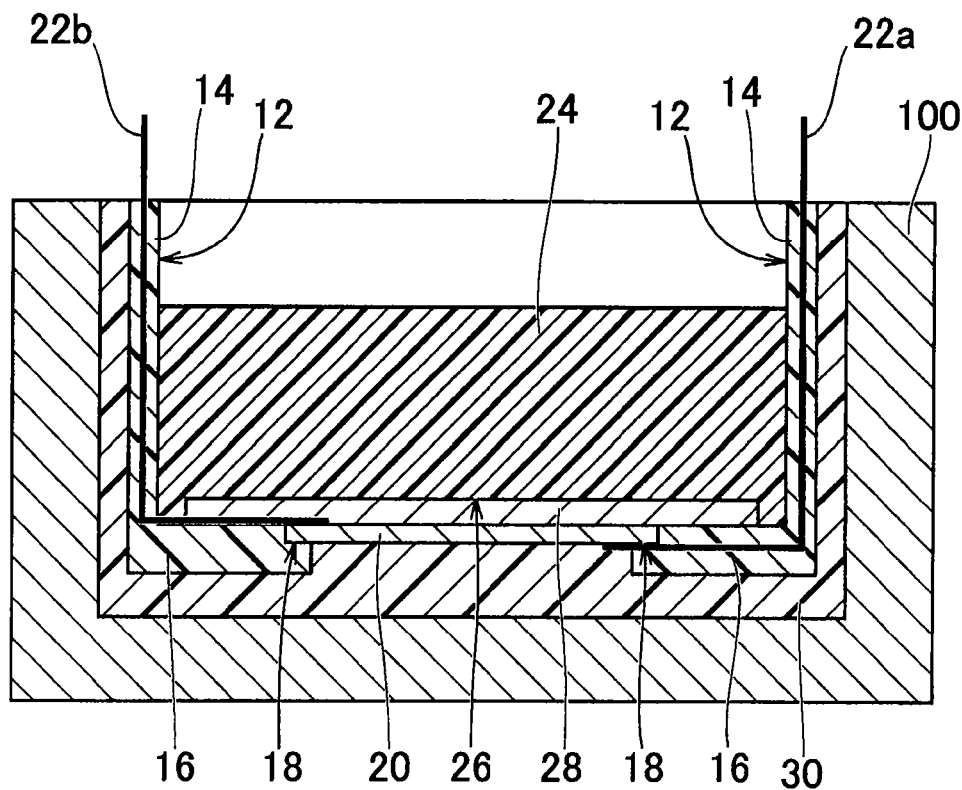
FIG. 6 is a side view illustrating the process of manufacturing the ultrasonic sensor shown in FIG. 1.

As shown in FIGS. 5 and 6, the base 12 to which the piezoelectric element 20 and the weight 24, for example, are fixed is inserted into a filling mold 100 with a bottom for covering the outer surfaces of the base 12 and the piezoelectric element 20 and set at a predetermined position.

Subsequently, resin serving as a material of the outer casing 30 is applied in gaps between the base 12 and the filling mold 100 and between the piezoelectric element 20 and the filling mold 100, and cured. With this, the outer casing 30 is provided in gaps between the outer surface of the base 12 and the inner surface of the filling mold 100 and between the outer surface of the piezoelectric element 20 and the inner surface of the filling mold 100.

Subsequently, the filling mold 100 is removed from the outer casing 30. In this manner, the outer casing 30 is formed by molding using the filling mold 100.

The ultrasonic sensor 10 is manufactured through these steps.

In this ultrasonic sensor 10, the piezoelectric element 20 is driven by applying driving voltages to the lead wires 22a and 22b. When the piezoelectric element 20 is driven, bending vibration occurs in the piezoelectric element 20 and the outer casing 30 disposed thereon, and causes emission of ultrasonic waves in a direction orthogonal to the main surfaces of the piezoelectric element 20. When the ultrasonic waves emitted from the ultrasonic sensor 10 are reflected from an object to be detected and reach the ultrasonic sensor 10, the piezoelectric element 20 vibrates. The vibration is converted into electrical signals, and the electrical signals are output from the lead wires 22a and 22b. Therefore, the distance from the ultrasonic sensor 10 to the object to be detected can be measured by measuring the time period from the application of the driving voltages to the output of the electrical signals.

In this case, the piezoelectric element 20 can be accurately positioned since the piezoelectric element 20 is disposed on the recessed portion 18 provided in the bent portion 16 of the base 12 in this ultrasonic sensor 10, and variations in transmitting/receiving characteristics can be reduced.

Moreover, in this case, since the piezoelectric element 20 is disposed on the recessed portion 18 provided in the inner surface of the bent portion 16 of the base 12 in this ultrasonic sensor 10, the thickness (amount) of the outer casing 30 provided on a surface of the piezoelectric element 20 adjacent to a transmitting/receiving side is increased compared with the case where the piezoelectric element 20 is disposed on the outer surface (transmitting/receiving side) of the bent portion 16 of the base 12. With this, bending or bending vibration can easily occur due to the imbalance of the vibration transmitted on both surfaces of the piezoelectric element 20. Thus, characteristics of sound pressure and sensitivity as an ultrasonic sensor can be improved, and desired transmitting/receiving characteristics can be obtained.

Moreover, it is preferable that the height of the ring-shaped recessed portion 18 is substantially the same as the thickness of the piezoelectric element 20 as in this ultrasonic sensor 10. With this, the piezoelectric element 20 can be firmly fixed by the recessed portion 18 of the bent portion 16 and the sound absorber 28, resulting in more stable transmitting/receiving characteristics.

Furthermore, in this ultrasonic sensor 10, it is preferable that height (thickness) of the ring-shaped recessed portion 18 is selected depending on the materials of the piezoelectric element 20 and the outer casing 30 such that the vibrational frequency of the piezoelectric element 20 corresponds to the natural frequency of the outer casing 30 disposed on the piezoelectric element and the piezoelectric element and the outer casing resonate. With this, bending vibration with larger amplitude can be obtained, and the transmitting/receiving characteristics can be stabilized.

Figure 7:
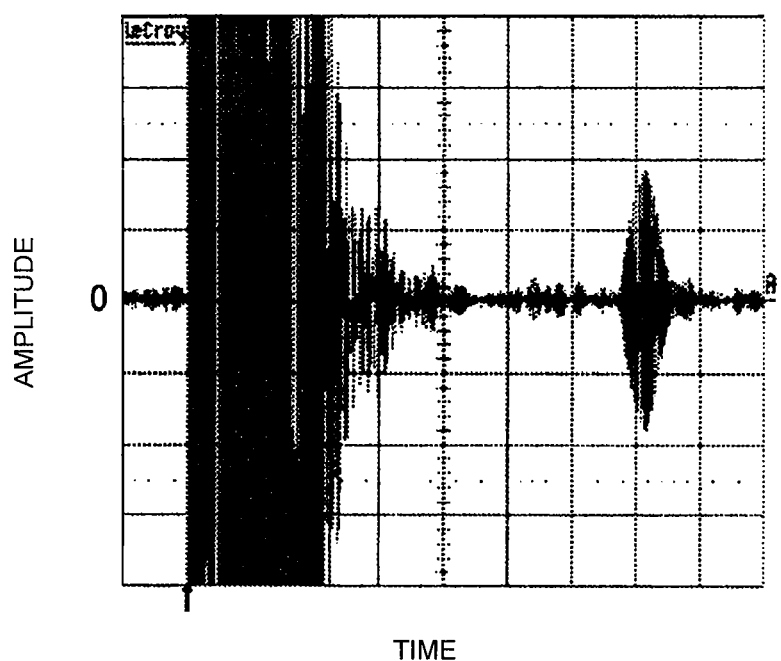
FIG. 7 illustrates the reverberation characteristic of the ultrasonic sensor shown in FIG. 1 when driving voltages are applied.
Figure 23:
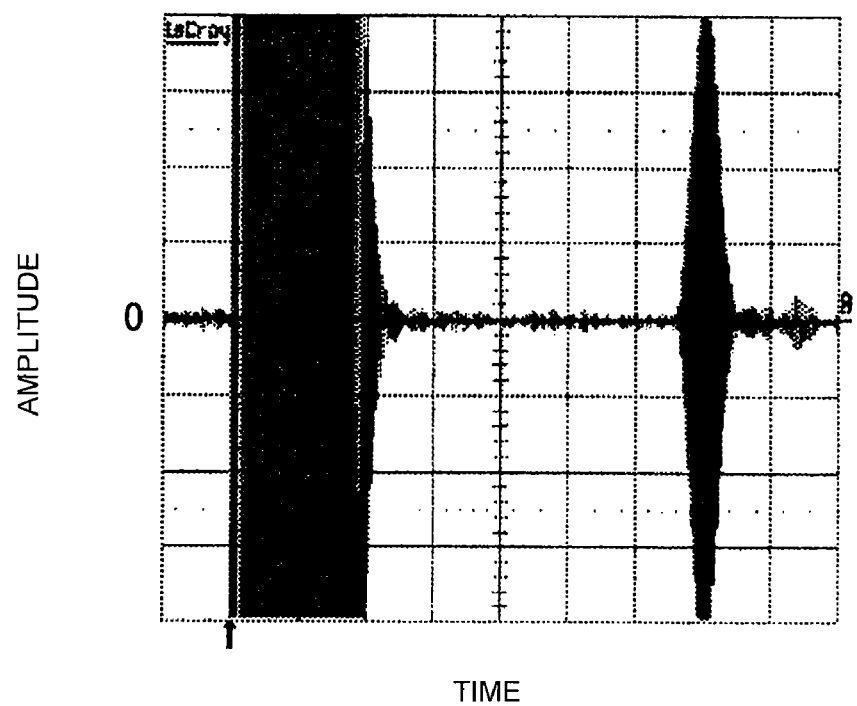
FIG. 23 illustrates the reverberation characteristic of the ultrasonic sensor shown in FIG. 21 when driving voltages are applied.

The resonant frequency of this ultrasonic sensor 10 is 45 kHz. FIG. 7 illustrates the reverberation characteristic of the ultrasonic sensor 10 when driving voltages are applied. FIG. 7 illustrates a result when the same driving circuit as that used for obtaining the result shown in FIG. 23 is used. As is clear from FIGS. 7 and 23, although the sensitivity of the ultrasonic sensor 10 shown in FIG. 1 is reduced to a level approximately one-half that of the ultrasonic sensor 1 shown in FIG. 21, the ultrasonic sensor 10 has a reverberation time substantially equal to that of the ultrasonic sensor 1, and can transmit and receive ultrasonic waves according to the principle that bending vibration occurs since the outer casing 30 disposed on the piezoelectric element 20 does not expand or contract even when the piezoelectric element expands or contracts (vibrates).

Figure 8:
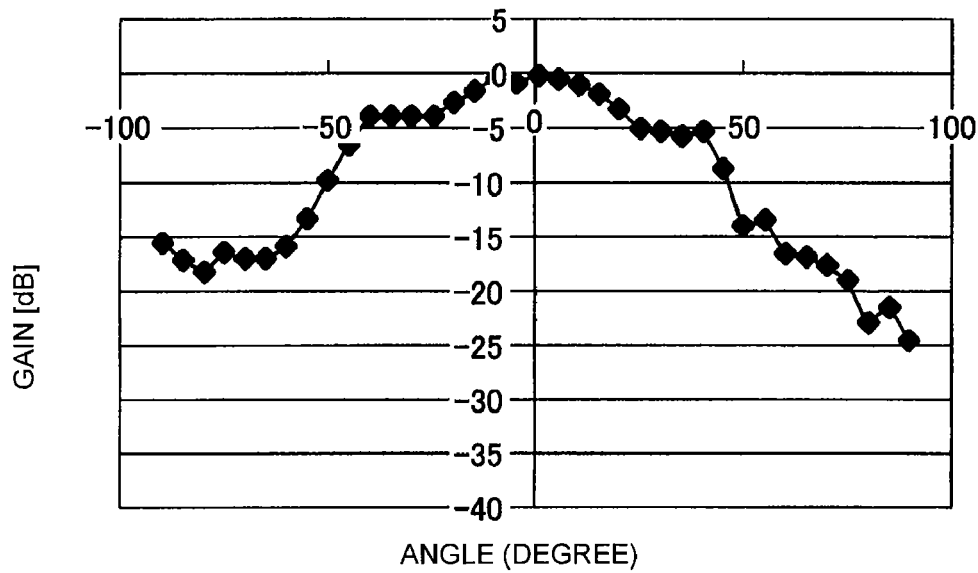
FIG. 8 illustrates the directivity of the ultrasonic sensor shown in FIG. 1 in the horizontal direction when the longitudinal direction of a depressed portion provided in the weight corresponds to the vertical direction.
Figure 9:
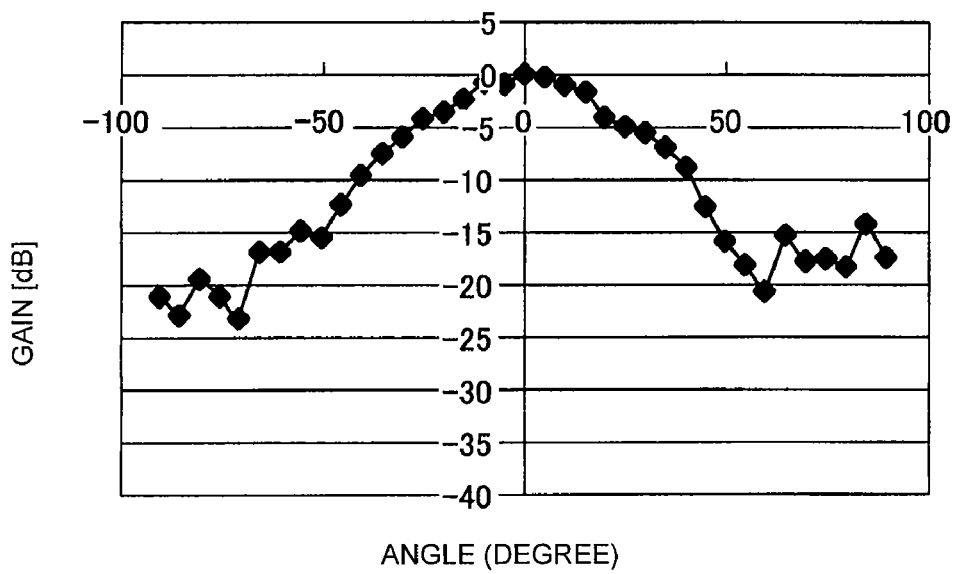
FIG. 9 illustrates the directivity of the ultrasonic sensor shown in FIG. 1 in the vertical direction when the longitudinal direction of the depressed portion provided in the weight corresponds to the vertical direction.

Moreover, the depressed portion 26 of the weight 24 is short in the width direction and is long in the length direction orthogonal to the width direction in this ultrasonic sensor 10. Thus, the ultrasonic sensor has a wide directivity in the width direction of the depressed portion 26 and a narrow directivity in the length direction (longitudinal direction) of the depressed portion 26. Therefore, when the ultrasonic sensor 10 is used for, for example, rear sonar devices or corner sonar devices for automobiles, the ultrasonic sensor is disposed such that the width direction of the depressed portion 26 corresponds to the horizontal direction and the longitudinal direction of the depressed portion 26 corresponds to the vertical direction. FIG. 8 illustrates the directivity of the ultrasonic sensor 10 in the horizontal direction when the longitudinal direction of the depressed portion 26 provided in the weight 24 corresponds to the vertical direction, and FIG. 9 illustrates the directivity in the vertical direction in this case. As is clear from FIGS. 8 and 9, the ultrasonic sensor 10 has a wide directivity in the width direction of the depressed portion 26 and a narrow directivity in the longitudinal direction of the depressed portion 26. In this manner, the directivity of the ultrasonic sensor 10 can be changed by changing the shape of the depressed portion 26 of the weight 24, and can be controlled with a simple structure.

Furthermore, since unnecessary vibration of the side portion 14 of the base 12 can be suppressed by the weight 24 in this ultrasonic sensor 10, only the necessary vibrating surface can be efficiently vibrated. In this case, since the weight 24 is composed of a material with a density higher than those of the base 12 and the outer casing 30, unnecessary vibration of the side portion 14 of the base 12 can be further suppressed compared with the case where the weight is composed of a low-density material.

Moreover, since the sound absorber 28 is disposed in the depressed portion 26 of the weight 24 in this ultrasonic sensor 10, the reverberation characteristic can be improved.

Figure 21:
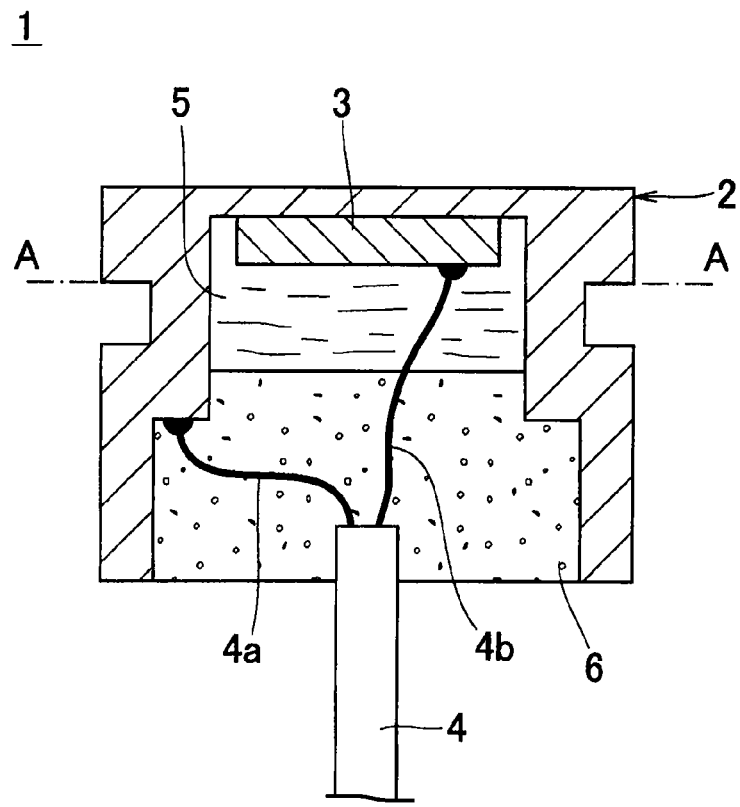
FIG. 21 is a front view illustrating an example of a known ultrasonic sensor.
Figure 22:
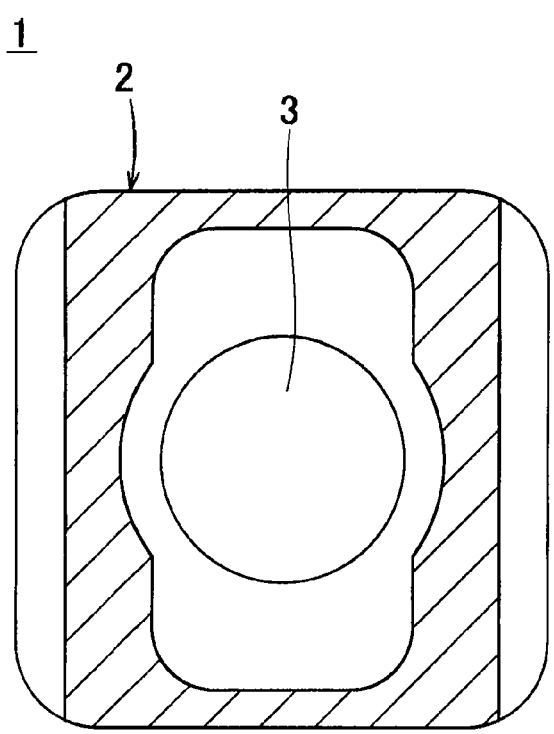
FIG. 22 is a plan view of the ultrasonic sensor shown in FIG. 21.

Furthermore, this ultrasonic sensor 10 does not include a high-cost metallic case, unlike the ultrasonic sensor 1 shown in FIG. 21, which requires high bonding skills for bonding the piezoelectric element or high processing accuracy of the bonding surface, and employs a technique such as molding using a filling mold. Thus, the cost can be reduced by, for example, about one-half, and manufacturing control is facilitated since high processing accuracy is not required.

That is, since the piezoelectric element 20 is disposed without using an adhesive in this ultrasonic sensor 10, it is not necessary to control, for example, the amount of adhesive or the pressure during bonding of the piezoelectric element 3 to the case 2 using an adhesive, unlike the ultrasonic sensor 1 shown in FIG. 21. Therefore, the ultrasonic sensor 10 is not affected by curing conditions such as the amount of adhesive and the pressure during bonding of the piezoelectric element and the surface roughness and the flatness of an object to which the piezoelectric element is bonded. Moreover, warpage of components caused by bonding can also be prevented.

Furthermore, since the resin outer casing 30 is provided by molding on the outer surface of the piezoelectric element 20 in this ultrasonic sensor 10, the flatness at a connecting portion of the piezoelectric element 20 and the outer casing 30 can be low.

Moreover, since this ultrasonic sensor 10 does not include a case composed of a metal such as aluminum, the electrical connection of, for example, the piezoelectric element is not destabilized by oxidized films formed by oxidation of the case.

Furthermore, since this ultrasonic sensor 10 does not include a case composed of aluminum, it is not necessary to use a special solder for aluminum for electrically connecting the lead wires.

Moreover, this ultrasonic sensor 10 does not require silicon rubber or urethane rubber whose physical properties vary widely, unlike the ultrasonic sensor 1 shown in FIG. 21 that includes silicon rubber or urethane rubber inside the case 2 so as to suppress continuous vibration of the metallic case 2.

The substantially elliptic depressed portion 26 is provided at the center of the first main surface of the columnar weight 24 in the above-described ultrasonic sensor 10. However, a weight shown in FIGS. 10(A) and 10(B), 11(A) and 11(B), 12(A) and 12(B), or 13(A) and 13(B), for example, can be used in the ultrasonic sensor according to the present invention.

Figure 10A:
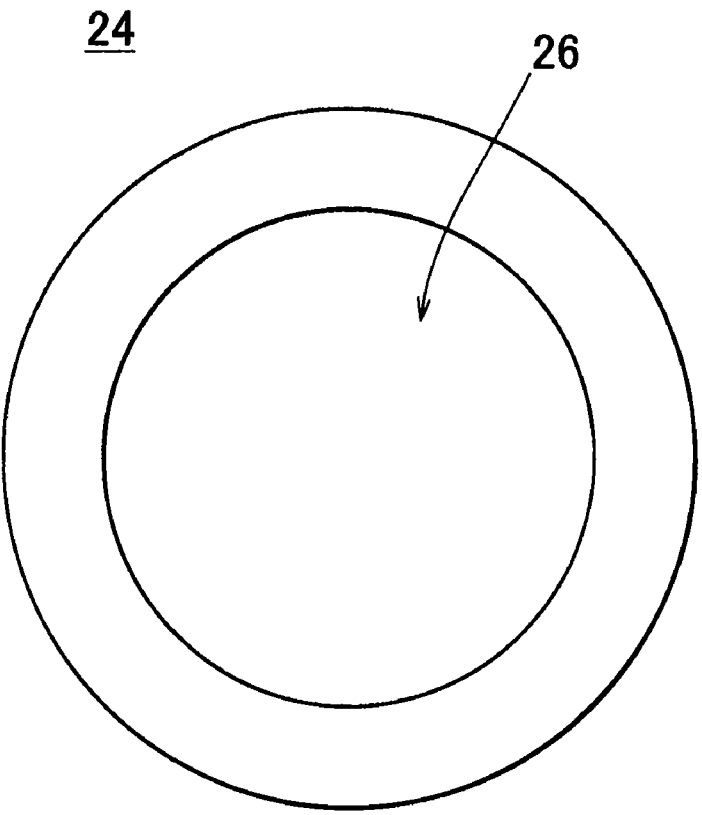
FIG. 10(A) is a plan view illustrating another example of a weight used for the ultrasonic sensor according to the present invention.
Figure 10B:
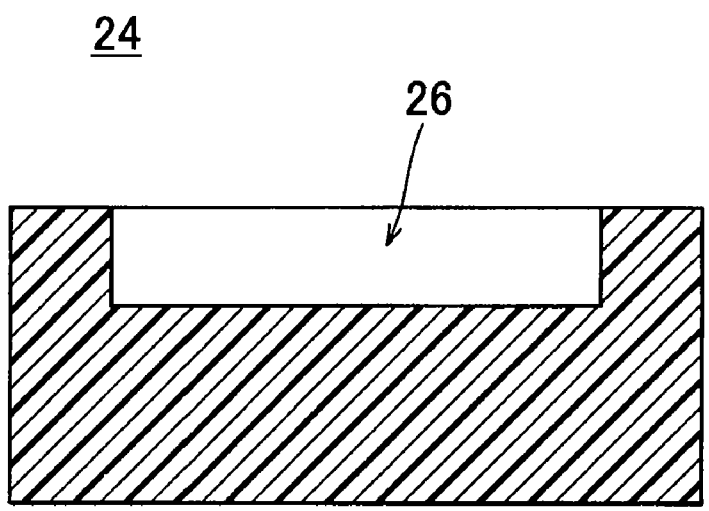
FIG. 10(B) is a vertical sectional view of the weight.

FIG. 10(A) is a plan view illustrating another example of a weight used for the ultrasonic sensor according to the present invention, and FIG. 10(B) is a vertical sectional view of the weight. A weight 24 shown in FIGS. 10(A) and 10(B) has a columnar shape as a whole, and a columnar depressed portion 26 is provided at the center of a first main surface of the weight.

Figure 11A:
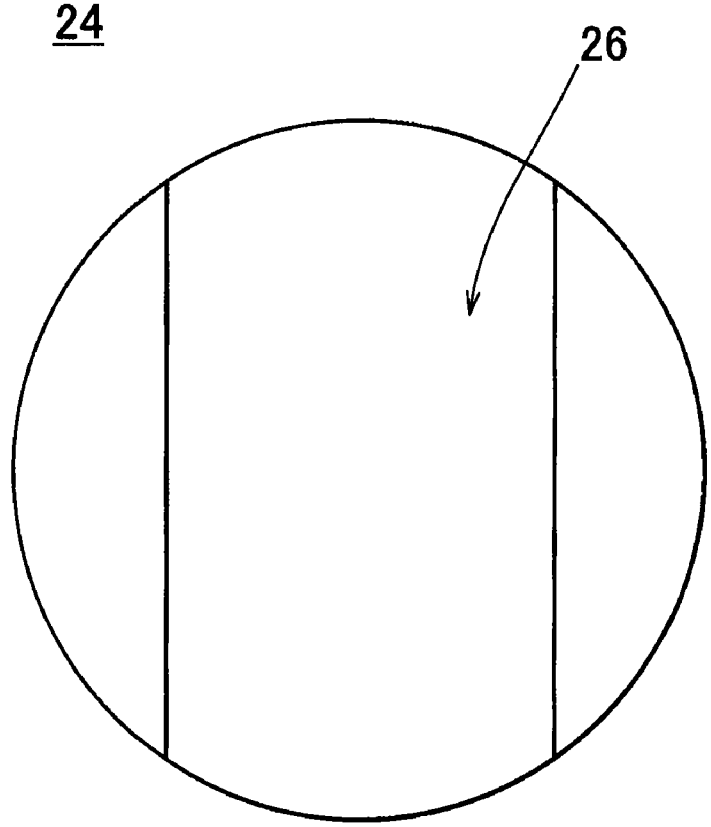
FIG. 11(A) is a plan view illustrating yet another example of a weight used for the ultrasonic sensor according to the present invention.
Figure 11B:
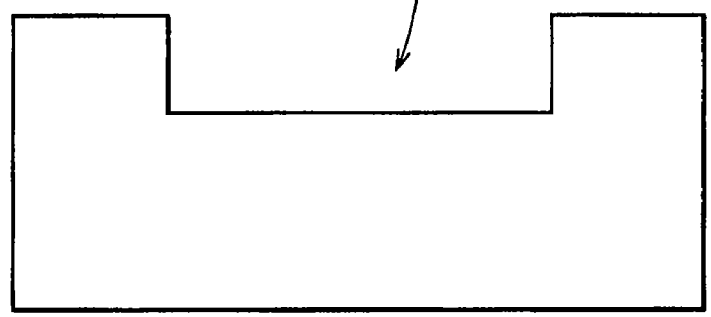
FIG. 11(B) is a front view of the weight.

FIG. 11(A) is a plan view illustrating yet another example of a weight used for the ultrasonic sensor according to the present invention, and FIG. 11(B) is a front view of the weight. A weight 24 shown in FIGS. 11(A) and 11(B) has a columnar shape as a whole, and an oblong depressed portion 26 is provided in a first main surface of the weight.

Figure 12A:
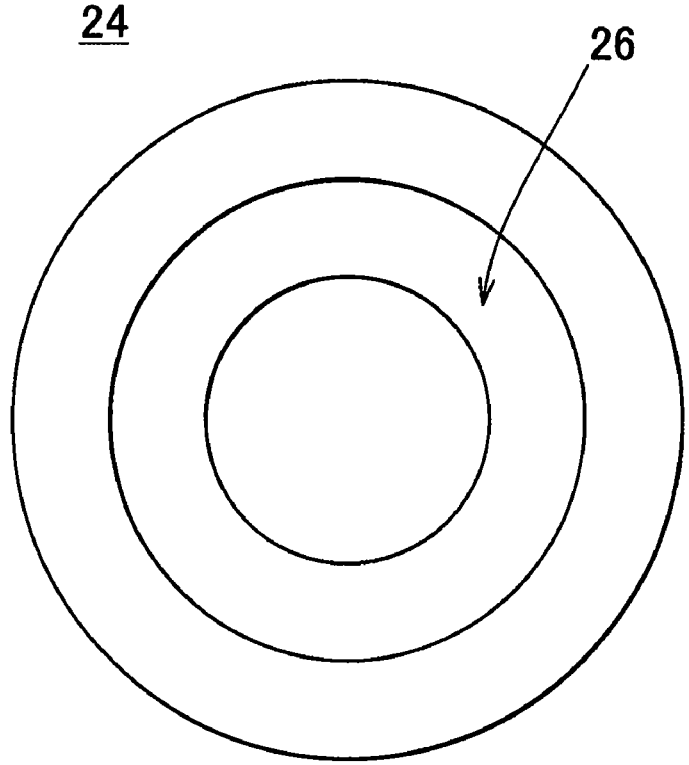
FIG. 12(A) is a plan view illustrating yet another example of a weight used for the ultrasonic sensor according to the present invention.
Figure 12B:
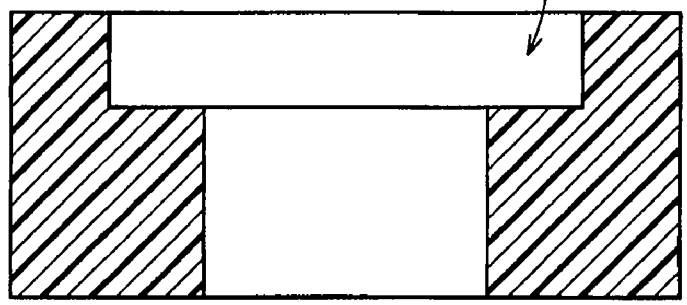
FIG. 12(B) is a vertical sectional view of the weight.

FIG. 12(A) is a plan view illustrating yet another example of a weight used for the ultrasonic sensor according to the present invention, and FIG. 12(B) is a vertical sectional view of the weight. A weight 24 shown in FIGS. 12(A) and 12(B) has a cylindrical shape as a whole, and a columnar depressed portion 26 is provided in a first main surface of the weight.

Figure 13A:
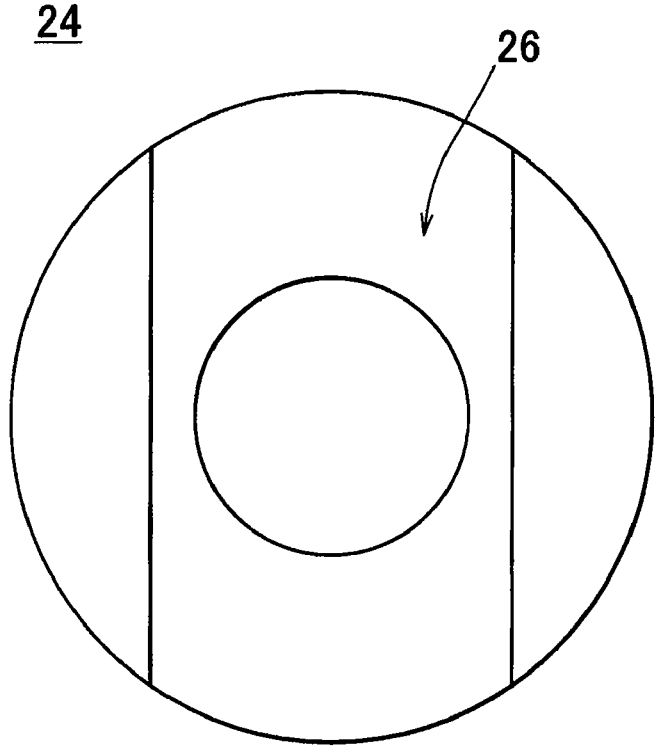
FIG. 13(A) is a plan view illustrating yet another example of a weight used for the ultrasonic sensor according to the present invention.
Figure 13B:
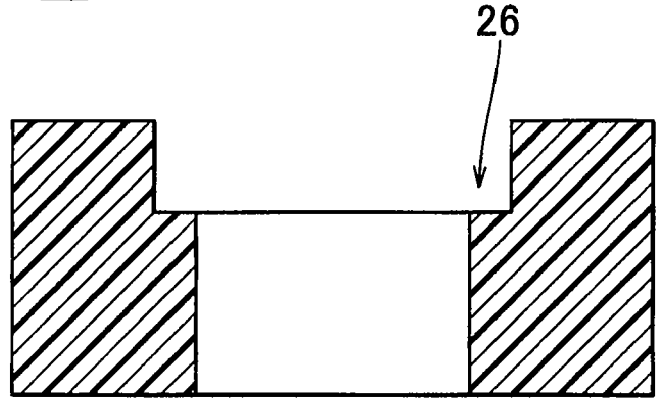
FIG. 13(B) is a vertical sectional view of the weight.

FIG. 13(A) is a plan view illustrating yet another example of a weight used for the ultrasonic sensor according to the present invention, and FIG. 13(B) is a vertical sectional view of the weight. A weight 24 shown in FIGS. 13(A) and 13(B) has a cylindrical shape as a whole, and an oblong depressed portion 26 is provided in a first main surface of the weight.

When the weight 24 shown in FIGS. 10(A) and 10(B) or the weight 24 shown in FIGS. 12(A) and 12(B) is used for the ultrasonic sensor, the directivity becomes isotropic. When the weight 24 shown in FIGS. 11(A) and 11(B) or the weight 24 shown in FIGS. 13(A) and 13(B) is used for the ultrasonic sensor, the directivity becomes anisotropic as that of the ultrasonic sensor 10 shown in FIG. 1.

In this manner, the directivity of the ultrasonic sensor can be controlled by the shape of the weight 24 used for the ultrasonic sensor.

Moreover, when the weight 24 shown in FIGS. 12(A) and 12(B) or the weight 24 shown in FIGS. 13(A) and 13(B) is used for the ultrasonic sensor, the reverberation characteristic can be further improved by placing an sound absorber composed of an elastic material such as sponge in the hollow portion at the center of the weight 24 in addition to the depressed portion 26 of the weight 24.

Figure 14:
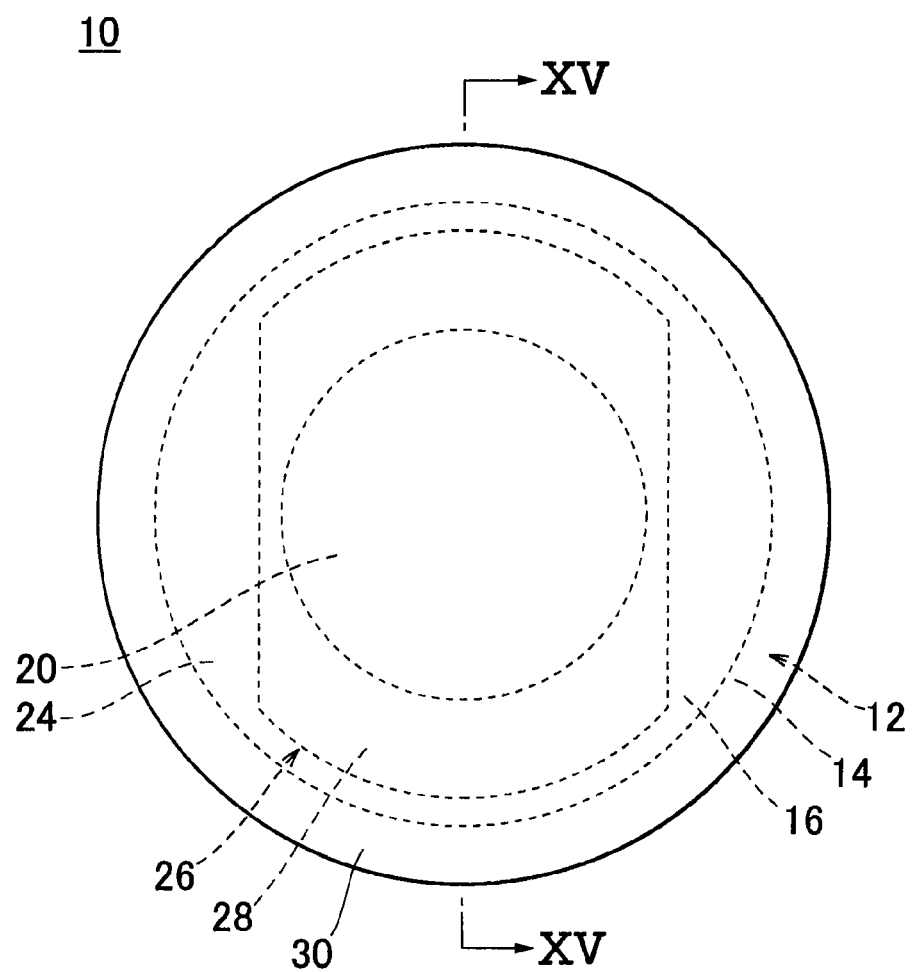
FIG. 14 is a plan view illustrating another example of the ultrasonic sensor according to the present invention.
Figure 15:
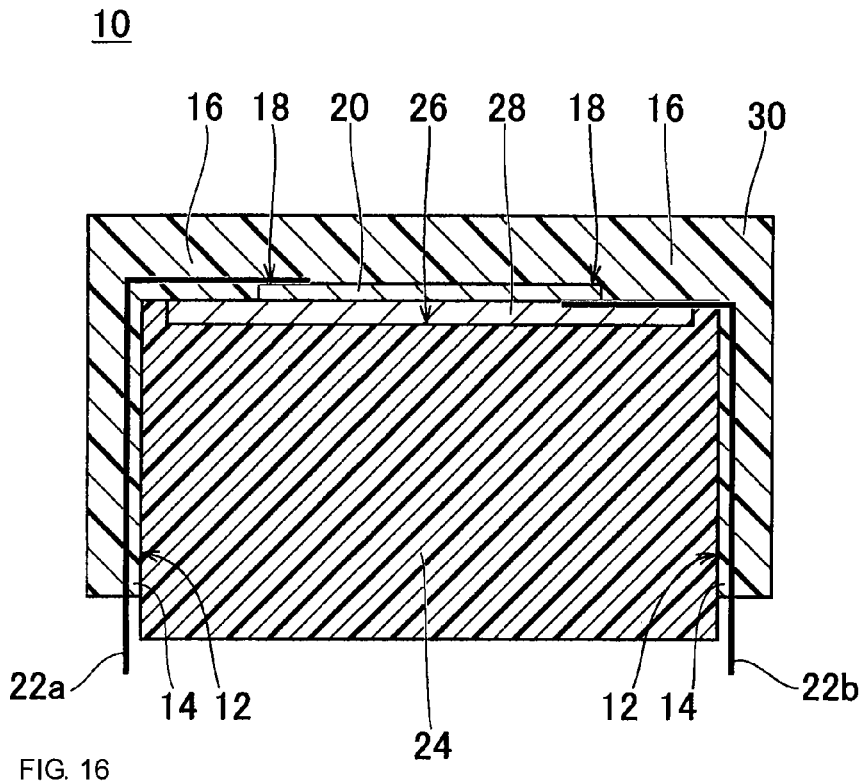
FIG. 15 is a cross-sectional view taken along line XV-XV in FIG. 14.

FIG. 14 is a plan view illustrating another example of the ultrasonic sensor according to the present invention, and FIG. 15 is a cross-sectional view taken along line XV-XV in FIG. 14. Unlike the ultrasonic sensor 10 shown in FIG. 1, the base 12 and the outer casing 30 are composed of the same resin material and integrated with each other in the ultrasonic sensor 10 shown in FIG. 14. The base 12 can be composed of a metal instead of the same resin material as the outer casing 30.

Moreover, the height of the weight 24 in the ultrasonic sensor 10 shown in FIG. 14 is larger than that in the ultrasonic sensor 10 shown in FIG. 1 such that the weight partially protrudes outward from the second opening of the base 12. The weight 24 can be composed of the same material as the sound absorber 28.

The ultrasonic sensor 10 shown in FIG. 14 also produces substantially the same effect as that of the ultrasonic sensor 10 shown in FIG. 1.

Furthermore, unlike the ultrasonic sensor 10 shown in FIG. 1, the base 12 and the outer casing 30 are composed of the same resin material and integrated with each other in the ultrasonic sensor 10 shown in FIG. 14. Thus, the number of parts can be reduced, and the cost can also be reduced due to the reduction in the number of parts.

Figure 16:
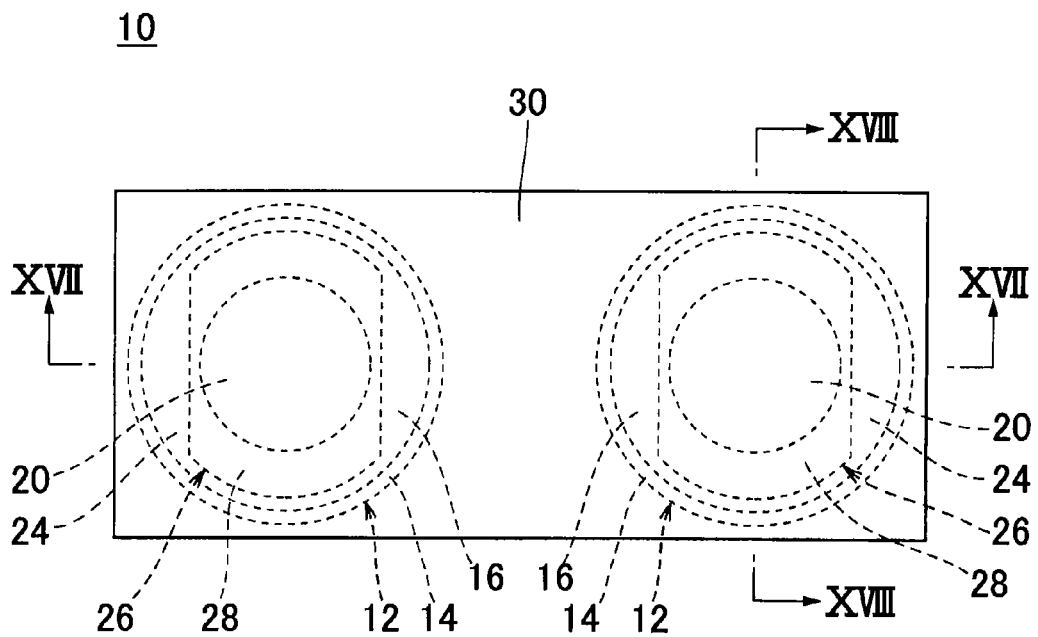
FIG. 16 is a plan view illustrating yet another example of the ultrasonic sensor according to the present invention.
Figure 17:
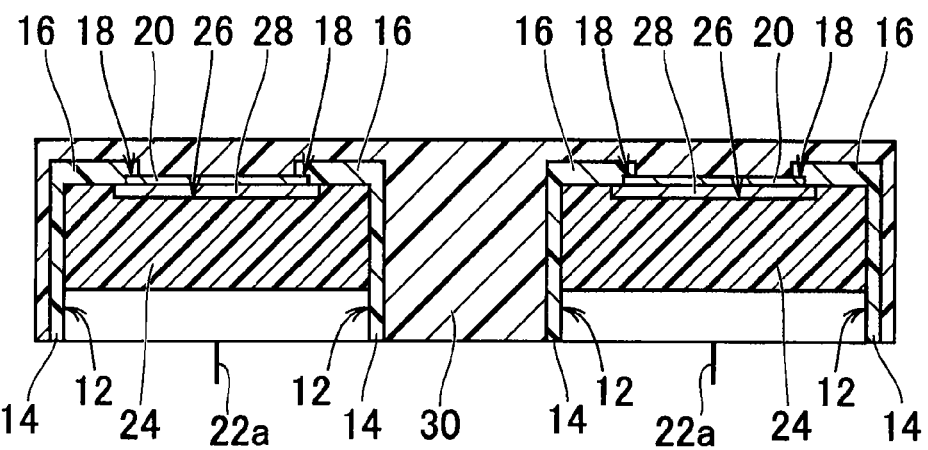
FIG. 17 is a cross-sectional view taken along line XVII-XVII in FIG. 16.
Figure 18:
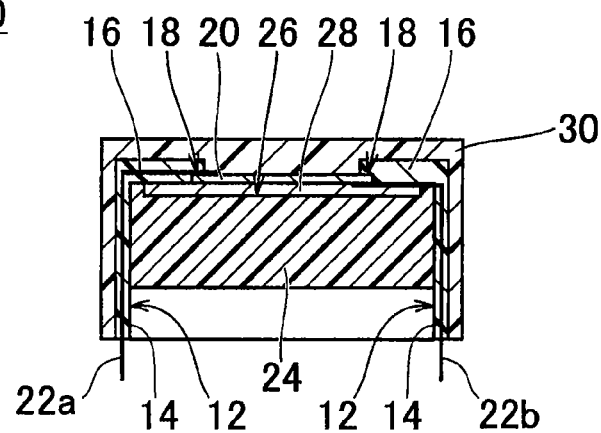
FIG. 18 is a cross-sectional view taken along line XVIII-XVIII in FIG. 16.

FIG. 16 is a plan view illustrating yet another example of the ultrasonic sensor according to the present invention, FIG. 17 is a cross-sectional view taken along line XVII-XVII in FIG. 16, and FIG. 18 is a cross-sectional view taken along line XVIII-XVIII in FIG. 16. The ultrasonic sensor 10 shown in FIG. 16 corresponds to that including two ultrasonic sensors 10 shown in FIG. 1 disposed next to each other and integrated with each other.

That is, the ultrasonic sensor 10 shown in FIG. 16 includes two sets of the bases 12, the piezoelectric elements 20, the lead wires 22a and 22b, the weights 24, and the sound absorbers 28 in the ultrasonic sensor 10 shown in FIG. 1 except for the outer casing 30, and includes one outer casing 30 having an oblong rectangular shape when viewed in plan formed at the outer surfaces of the two sets of the bases 12 and the piezoelectric elements 20.

Moreover, the two piezoelectric elements 20 are disposed so as to be in the same plane, and the two weights 24 are disposed such that the longitudinal direction of the two depressed portions 26 is orthogonal to the longitudinal direction of the outer casing 30 in the ultrasonic sensor 10 shown in FIG. 16.

Next, an example method for manufacturing the ultrasonic sensor 10 shown in FIG. 16 will be described.

As in the above-described method for manufacturing the ultrasonic sensor 10 shown in FIG. 1, two sets of the bases 12 to which the piezoelectric elements 20 and the weights 24, for example, except for the outer casing 30 are fixed are prepared first.

Figure 19:
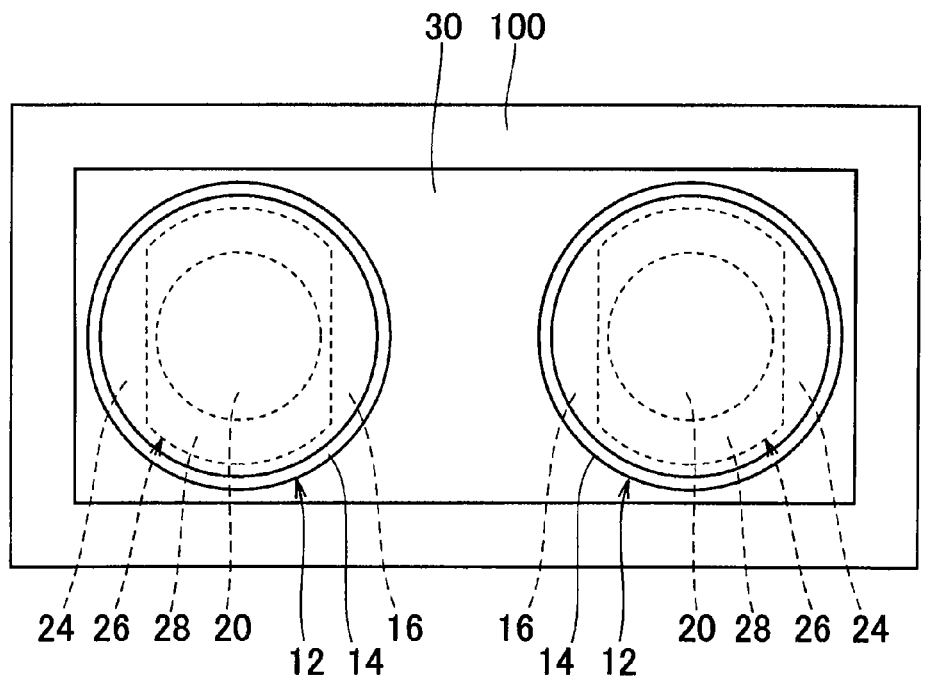
FIG. 19 is a plan view illustrating a process of manufacturing the ultrasonic sensor shown in FIG. 16.
Figure 20:
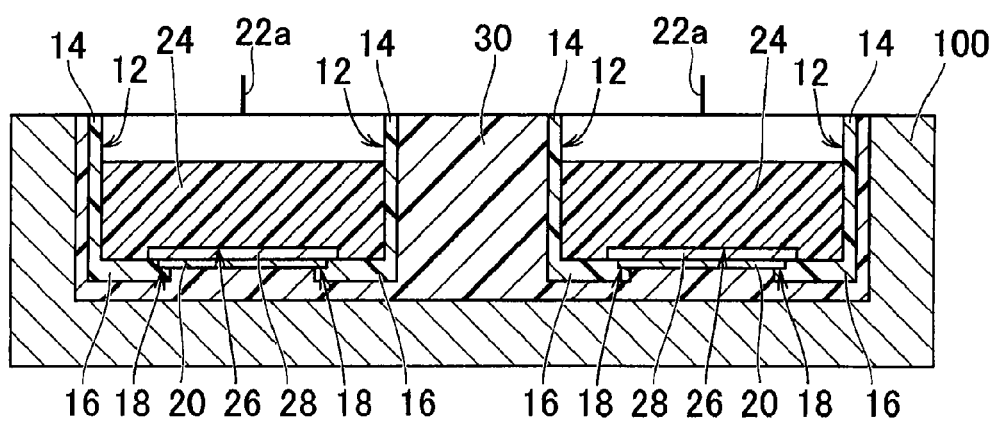
FIG. 20 is a front view illustrating the process of manufacturing the ultrasonic sensor shown in FIG. 16.

As shown in FIGS. 19 and 20, the two sets of the bases 12 to which the piezoelectric elements 20 and the weights 24, for example, are fixed are inserted into a filling mold 100 with a bottom for covering the outer surfaces of the two sets of the bases 12 and the outer surfaces of the two sets of the piezoelectric elements 20 and set at a predetermined position.

Subsequently, resin serving as a material of the outer casing 30 is applied in gaps between the two sets of the bases 12 and the filling mold 100 and between the two sets of the piezoelectric elements 20 and the filling mold 100, and cured. With this, the outer casing 30 is provided in gaps between the outer surfaces of the two sets of the bases 12 and the inner surface of the filling mold 100 and between the outer surfaces of the two sets of the piezoelectric elements 20 and the inner surface of the filling mold 100.

Subsequently, the filling mold 100 is removed from the outer casing 30.

The ultrasonic sensor 10 shown in FIG. 16 is manufactured through these steps.

The ultrasonic sensor 10 shown in FIG. 16 also produces substantially the same effect as that of the ultrasonic sensor 10 shown in FIG. 1.

Furthermore, unlike the ultrasonic sensor 10 shown in FIG. 1, the ultrasonic sensor 10 shown in FIG. 16 includes the two piezoelectric elements 20. Thus, the ultrasonic sensor can measure the angle to an object to be detected such as an obstacle in addition to the distance to the object to be detected.

When an ultrasonic sensor using a metallic case includes a plurality of piezoelectric elements, it is very difficult to machine the metallic case, and the production cost is high. However, the ultrasonic sensor 10 shown in FIG. 16 does not include a metallic case, and the outer casing 30 is provided by being molded on, for example, the outer surfaces of the plurality of piezoelectric elements 20. Therefore, complicated metalworking is not required even when the ultrasonic sensor includes the plurality of piezoelectric elements 20, and the ultrasonic sensor can be easily manufactured, resulting in a reduction in cost.

Although the sizes, shapes, positions, materials, and numbers of components in the examples of the ultrasonic sensor 10 are specified above, these specifications can be changed as appropriate in the present invention, and characteristics such as the directivity and the reverberation characteristic can be further improved by the change.

Moreover, the lead wires 22a and 22b are used for electrical connection to the exterior in the examples of the ultrasonic sensor 10. However, pin terminals or other connecting members can be used for the electrical connection to the exterior.

INDUSTRIAL APPLICABILITY

The ultrasonic sensor according to the present invention is used for, for example, rear sonar devices or corner sonar devices for automobiles.

The invention claimed is:

1. An ultrasonic sensor comprising:
   a piezoelectric element;
   a base sized to accommodate the piezoelectric element, the base having:
      a side portion that defines a first opening; and
      a bent portion extending inward from the first opening of the side portion, the bent portion having a recessed portion within which the piezoelectric element is disposed such that the first opening is closed by the piezoelectric element; and
   a casing covering an outer surface of the piezoelectric element and an outer surface of the base.

2. The ultrasonic sensor according to claim 1, wherein bending vibration occurs in the casing during driving.

3. The ultrasonic sensor according to claim 1, further comprising:
   a weight fitted in the base so as to be in contact with an inner surface of the base.

4. The ultrasonic sensor according to claim 3, wherein the weight includes a depressed portion facing the piezoelectric element.

5. The ultrasonic sensor according to claim 4, wherein the depressed portion is sized so as to prevent the piezoelectric element from contacting the piezoelectric element.

6. The ultrasonic sensor according to claim 4, further comprising a sound absorber fitted within the depressed portion.

7. The ultrasonic sensor according to claim 4, wherein the depressed portion is in the shape of one of elliptical, columnar, oblong and cylindrical.

8. The ultrasonic sensor according to claim 3, wherein the weight is shaped such that the directivity of the ultrasonic sensor is isotropic.

9. The ultrasonic sensor according to claim 3, wherein the weight is shaped such that the directivity of the ultrasonic sensor is anisotropic.

10. The ultrasonic sensor according to claim 3, wherein the weight is composed of a material with a density higher than densities of the materials of the base and the casing.

11. The ultrasonic sensor according to claim 3, wherein the weight partially protrudes from a second opening in the base opposite the first opening.

12. The ultrasonic sensor according to claim 3, wherein the weight is composed of a material with a density higher than densities of the materials of the base and the casing.

13. The ultrasonic sensor according to claim 1, wherein the base and the casing are composed of the same material and integrated with each other.

14. The ultrasonic sensor according to claim 1, wherein a height of the recessed portion substantially corresponds to a thickness of the piezoelectric element.

15. The ultrasonic sensor according to claim 1, further comprising at least a pair of lead wires embedded in the side portion and the bent portion of the base.

16. The ultrasonic sensor according to claim 1, wherein
   the ultrasonic sensor further comprises at least two piezoelectric elements and at least two bases, each base corresponding to a respective piezoelectric element, and
   the outer casing covers outer surfaces of the at least two piezoelectric elements and outer surfaces of the at least two bases.

* * * * *